United States Patent [19]

Kawano et al.

[11] Patent Number: 5,607,614
[45] Date of Patent: Mar. 4, 1997

[54] PIEZOELECTRIC CERAMIC COMPOSITIONS

[75] Inventors: Koichi Kawano, Shiga-ken; Mitsuru Sube, Yokaichi, both of Japan

[73] Assignee: Murata Manufacturing Co., Ltd., Japan

[21] Appl. No.: 588,859

[22] Filed: Jan. 19, 1996

[30] Foreign Application Priority Data

Jan. 20, 1995 [JP] Japan .................... 7-026321

[51] Int. Cl.$^6$ .................................... C04B 35/46
[52] U.S. Cl. .................. 252/62.9 PZ; 501/134; 501/135; 501/136
[58] Field of Search ............. 252/62.9 PZ; 501/134, 501/135, 136

[56] References Cited

U.S. PATENT DOCUMENTS 3,544,470 12/1970 Tsubouchi et al. ............. 252/62.9 PZ
4,565,642 7/1983 Jyomura et al. ................ 252/62.9

FOREIGN PATENT DOCUMENTS 1580831 12/1967 France .
48-12355 4/1973 Japan ............... 252/62.9 PZ
61-117158 6/1986 Japan ............... 252/62.9 PZ Primary Examiner—Melissa Bonner
Attorney, Agent, or Firm—Ostrolenk, Faber, Gerb & Soffen, LLP

[57] ABSTRACT

A piezoelectric ceramic composition is expressed by a general formula:

$$aPb(Mn_xSb_{(2-4x)}W_{(3x-1)})O_3\text{-}bPbTiO_3\text{-}cPbZrO_3$$

where a, b, and c are in ranges $2 \leq a \leq 10$, $40 \leq b \leq 52$, and $38 \leq c \leq 58$, and $0.35 \leq x \leq 0.48$ respectively (a, b, and c represent mol %, and a+b+c=100). The composition has a large piezoelectric constant and a large mechanical quality factor, is stable in temperature characteristics, and can be fired at low temperatures.

4 Claims, No Drawings

PIEZOELECTRIC CERAMIC COMPOSITIONS

BACKGROUND OF THE INVENTION

1. Field of the Invention

The present invention relates to piezoelectric ceramic compositions and, more particularly, to piezoelectric ceramic compositions preferably used in ultrasonic motors, ultrasonic vibrators, piezoelectric actuators, and the like.

2. Description of the Related Art

It is preferable that the piezoelectric materials (piezoelectric ceramic compositions) used in ultrasonic motors, ultrasonic vibrators, piezoelectric actuators, and the like have a large mechanical quality factor, less heat generation during the application of a high voltage, a large piezoelectric constant, and a large amplitude of vibration.

Further, it is important for piezoelectric materials for ultrasonic motors to have stable temperature characteristics to be able to provide stable speed of rotation and torque.

For conventional piezoelectric ceramic compositions, however, it is difficult to keep both the mechanical quality factor and the piezoelectric constant sufficiently large, and the stability of the temperature characteristics is often not sufficient.

Piezoelectric ceramic compositions prepared to satisfy the above-described requirements as much as possible often have firing temperatures as high as 1200° to 1300° C.

SUMMARY OF THE INVENTION

The preferred embodiments of the present invention solve the above-described problems, and provide a piezoelectric ceramic composition suitable for use as a material for ultrasonic motors, ultrasonic vibrators, and piezoelectric actuators, the piezoelectric ceramic composition having a large piezoelectric constant and a large mechanical quality factor, stable temperature characteristics, and being adapted to be fired at low temperatures.

According to the preferred embodiments of the present invention, a piezoelectric ceramic composition has a general formula:

$$aPb(Mn_xSb_{(2-4x)}W_{(3x-1)})O_3\text{-}bPbTiO_3\text{-}cPbZrO_3$$

where a, b, and c are in ranges $2 \leq a \leq 10$, $40 \leq b \leq 52$, and $38 \leq c \leq 58$, respectively (a, b, and c represent mol %, and a+b+c=100).

According to another aspect of the preferred embodiments of the present invention, a piezoelectric ceramic composition comprises at least one of magnesium, cobalt, and nickel in a ratio of 0.50% or less by weight in terms of $Mg(OH)_2$, CoO, NiO, respectively, in a composition having a general formula:

$$aPb(Mn_xSb_{(2-4x)}W_{(3x-1)})O_3\text{-}bPbTiO_3\text{-}cPbZrO_3$$

where a, b, and c are in ranges $2 \leq a \leq 10$, $40 \leq b \leq 52$, and $38 \leq c \leq 58$, respectively (a, b, and c represent mol %, and a+b+c=100).

According to another aspect of the preferred embodiments of the present invention, there is provided a piezoelectric ceramic composition having a general formula:

$$aPb(Mn_xSb_{(2-4x)}W_{(3x-1)})O_3\text{-}cPbZrO_3$$

where a, b, and c are in ranges $2 \leq a \leq 10$, $40 \leq b \leq 52$, and $38 \leq c \leq 58$, respectively (a, b, and c represent mol %, and a+b+c=100) and wherein up to 5% of lead is replaced by at least one of calcium, strontium, barium, and lanthanum, According to still another aspect of the preferred embodiments of the present invention, there is provided a piezoelectric ceramic composition expressed by a general formula:

$$aPb(Mn_xSb_{(2-4x)}W_{(3x-1)})O_3\text{-}bPbTiO_3\text{-}cPbZrO_3$$

where a, b, and c are in ranges $2 \leq a \leq 10$, $40 \leq b \leq 52$, and $38 \leq c \leq 58$, respectively (a, b, and c represent mol %, and a+b+c=100), wherein up to 5% of lead is replaced by at least one of calcium, strontium, barium, and lanthanum and including at least one of magnesium, cobalt, and nickel in a ratio of 0.50% or less by weight in terms of $Mg(OH)_2$, CoO, and NiO.

DETAILED DESCRIPTION OF PREFERRED EMBODIMENTS

The features of the present invention will now be more specifically described with reference to a preferred embodiments thereof.

Materials and additives PbO, $TiO_2$, $ZrO_2$, $MnCO_3$, $Sb_2O_3$, $WO_3$ are weighed to obtain the compositions as shown in Tables 1 through 4 and are subjected to wet mixing using a ball mill with a basic composition expressed by a general formula:

$$aPb(Mn_xSb_{(2-4x)}W_{(3x-1)})O_3\text{-}bPbTiO_3\text{-}cPbZrO_3 \qquad (1)$$

where a+b+c=100, the ratios of x, a, b, and c being varied as shown in Tables 1 through 4. The values of magnesium, cobalt, and nickel in Tables 1 through 4 are the values of added magnesium, cobalt, and nickel compounds in terms of $Mg(OH)_2$, CoO, and NiO, respectively.

The mixtures obtained as a result of the wet mixing are calcined for two hours at 850° to 950° C., and the calcined materials are subjected to wet pulverization using a ball mill to obtain conditioned powders.

The conditioned powders are subjected to press molding after being combined with water or a binder such as polyvinyl alcohol and are fired for two hours at a temperature of 1100° to 1200° C.

Next, the ceramics obtained as a result of the firing are ground to be in the form of a disc having a diameter of about 10 mm and a thickness of about 1 mm, and silver electrodes are applied on both end faces thereof. The ceramics are subjected to a polarization process for 60 minutes in an insulating oil at 80° C. using an electrical field of 3 to 4 KV to obtain piezoelectric ceramics.

Tables 1 through 4 show the measured characteristics of the piezoelectric ceramics obtained as described above.

TABLE 1

| Sample No | Composition | | | | | | | Firing Temp (°C.) | Characteristics | | |
|---|---|---|---|---|---|---|---|---|---|---|---|
| | X (%) | a (mol %) | b (mol %) | c (mol %) | Mg (% by weight) | Co (% by weight) | Ni (% by weight) | | $d_{31}$ (p C/N) | Qm | C-TC (ppm/°C.) |
| 1 | 34.5 | 6.0 | 48.0 | 46.0 | — | — | — | 1150 | 138 | 1850 | 2450 |
| 2 | 35.0 | 6.0 | 48.0 | 46.0 | — | — | — | 1150 | 164 | 1870 | 1870 |
| 3 | 39.0 | 6.0 | 48.0 | 46.0 | — | — | — | 1150 | 153 | 1880 | 1780 |
| 4 | 42.0 | 6.0 | 48.0 | 46.0 | — | — | — | 1150 | 150 | 1840 | 1660 |
| 5 | 48.0 | 6.0 | 48.0 | 46.0 | — | — | — | 1150 | 150 | 1980 | 1270 |
| 6 | 49.0 | 6.0 | 48.0 | 46.0 | — | — | — | 1150 | 98 | 2200 | 1300 |
| 7* | 42.0 | 1.0 | 44.0 | 55.0 | — | — | — | 1150 | 45 | 800 | 1860 |
| 8 | 42.0 | 2.0 | 44.0 | 54.0 | — | — | — | 1150 | 102 | 1400 | 2300 |
| 9 | 42.0 | 2.0 | 46.0 | 52.0 | — | — | — | 1150 | 126 | 1420 | 1860 |
| 10 | 42.0 | 2.0 | 50.0 | 48.0 | — | — | — | 1150 | 115 | 2170 | 1380 |
| 11 | 42.0 | 5.0 | 44.0 | 51.0 | — | — | — | 1150 | 125 | 2350 | 2010 |
| 12 | 42.0 | 5.0 | 46.0 | 49.0 | — | — | — | 1150 | 142 | 2350 | 1620 |
| 13 | 42.0 | 5.0 | 50.0 | 45.0 | — | — | — | 1150 | 118 | 2490 | 1330 |
| 14 | 42.0 | 10.0 | 44.0 | 46.0 | — | — | — | 1150 | 105 | 1960 | 3010 |
| 15 | 42.0 | 10.0 | 46.0 | 44.0 | — | — | — | 1150 | 152 | 1370 | 2290 |
| 16 | 42.0 | 10.0 | 50.0 | 40.0 | — | — | — | 1150 | 107 | 2240 | 1620 |
| 17* | 42.0 | 12.0 | 44.0 | 44.0 | — | — | — | 1150 | 52 | 650 | 3560 |
| 18* | 36.0 | 5.0 | 38.0 | 57.0 | — | — | — | 1150 | 48 | 3020 | 4530 |
| 19 | 36.0 | 5.0 | 40.0 | 55.0 | — | — | — | 1150 | 100 | 2020 | 3720 |
| 20 | 36.0 | 5.0 | 46.0 | 49.0 | — | — | — | 1150 | 142 | 1620 | 1920 |

*Examples for comparison according to the prior art

TABLE 2

| Sample No | Composition | | | | | | | Firing Temp (°C.) | Characteristics | | |
|---|---|---|---|---|---|---|---|---|---|---|---|
| | X (%) | a (mol %) | b (mol %) | c (mol %) | Mg (% by weight) | Co (% by weight) | Ni (% by weight) | | $d_{31}$ (p C/N) | Qm | C-TC (ppm/°C.) |
| 21 | 36.0 | 5.0 | 52.0 | 43.0 | — | — | — | 1150 | 99 | 2560 | 1250 |
| 22* | 36.0 | 5.0 | 54.0 | 41.0 | — | — | — | 1150 | 63 | 2870 | 970 |
| 23* | 36.0 | 5.0 | 58.0 | 37.0 | — | — | — | 1150 | 35 | 4230 | 1320 |
| 24 | 42.0 | 6.0 | 48.0 | 46.0 | 0.10 | — | — | 1150 | 138 | 3120 | 1520 |
| 25 | 42.0 | 6.0 | 48.0 | 46.0 | 0.15 | — | — | 1150 | 150 | 2500 | 1420 |
| 26 | 42.0 | 6.0 | 46.0 | 48.0 | 0.20 | — | — | 1150 | 102 | 2890 | 1990 |
| 27* | 42.0 | 6.0 | 48.0 | 46.0 | 0.20 | — | — | 1150 | 141 | 2420 | 1520 |
| 28 | 42.0 | 6.0 | 50.0 | 44.0 | 0.20 | — | — | 1150 | 115 | 2890 | 1180 |
| 29 | 42.0 | 6.0 | 46.0 | 48.0 | 0.30 | — | — | 1150 | 109 | 2920 | 1930 |
| 30 | 42.0 | 6.0 | 48.0 | 46.0 | 0.30 | — | — | 1150 | 152 | 2330 | 1440 |
| 31 | 42.0 | 6.0 | 49.0 | 45.0 | 0.30 | — | — | 1150 | 129 | 2780 | 1060 |
| 32 | 42.0 | 6.0 | 50.0 | 44.0 | 0.30 | — | — | 1150 | 114 | 3000 | 920 |
| 33 | 42.0 | 6.0 | 46.0 | 48.0 | 0.50 | — | — | 1150 | 125 | 1270 | 1830 |
| 34 | 42.0 | 6.0 | 48.0 | 46.0 | 0.50 | — | — | 1150 | 148 | 1160 | 1420 |
| 35* | 42.0 | 6.0 | 48.0 | 46.0 | 0.60 | — | — | 1150 | 165 | 560 | 1260 |
| 36 | 42.0 | 6.0 | 46.0 | 48.0 | — | 0.20 | — | 1150 | 125 | 2760 | 1820 |
| 37 | 42.0 | 6.0 | 48.0 | 46.0 | — | 0.20 | — | 1150 | 156 | 2330 | 1430 |
| 38 | 42.0 | 6.0 | 50.0 | 44.0 | — | 0.20 | — | 1150 | 118 | 2590 | 1110 |
| 39 | 42.0 | 6.0 | 48.0 | 46.0 | — | 0.50 | — | 1150 | 162 | 1320 | 1320 |
| 40* | 42.0 | 6.0 | 48.0 | 46.0 | — | 0.60 | — | 1150 | 166 | 690 | 1210 |

*Examples for comparison according to the prior art

TABLE 3

| Sample No | Composition | | | | | | | Firing Temp (°C.) | Characteristics | | |
|---|---|---|---|---|---|---|---|---|---|---|---|
| | X (%) | a (mol %) | b (mol %) | c (mol %) | Mg (% by weight) | Co (% by weight) | Ni (% by weight) | | $d_{31}$ (p C/N) | Qm | C-TC (ppm/°C.) |
| 41 | 42.0 | 6.0 | 46.0 | 48.0 | — | — | 0.20 | 1150 | 127 | 2650 | 2050 |
| 42 | 42.0 | 6.0 | 48.0 | 46.0 | — | — | 0.20 | 1150 | 148 | 2210 | 1330 |
| 43 | 42.0 | 6.0 | 50.0 | 46.0 | — | — | 0.20 | 1150 | 124 | 1330 | 1070 |
| 44 | 42.0 | 6.0 | 48.0 | 46.0 | — | — | 0.50 | 1150 | 144 | 1170 | 920 |
| 45* | 42.0 | 6.0 | 48.0 | 46.0 | — | — | 0.60 | 1150 | 155 | 730 | 960 |
| 46 | 42.0 | 5.0 | 49.0 | 46.0 | 0.20 | 0.10 | — | 1190 | 145 | 2250 | 1520 |
| 47 | 42.0 | 5.0 | 49.0 | 46.0 | 0.20 | — | 0.10 | 1190 | 138 | 2110 | 1380 |
| 48 | 42.0 | 5.0 | 49.0 | 46.0 | 0.40 | 0.10 | — | 1190 | 153 | 1200 | 1490 |
| 49* | 42.0 | 5.0 | 49.0 | 46.0 | 0.50 | 0.10 | — | 1190 | 142 | 610 | 1470 |

*Examples for comparison according to the prior art

TABLE 4

| Sample No. | X (%) | a (mol %) | b (mol %) | c (mol %) | Mg (% by weight) | Co (% by weight) | Ni (% by weight) | Type and quantity of element to replace Pb (mol %) | | Firing Temp (°C.) | $d_{31}$ (p C/N) | Qm | C-TC (ppm/°C.) |
|---|---|---|---|---|---|---|---|---|---|---|---|---|---|
| 50 | 420 | 6.0 | 48.0 | 46.0 | — | — | — | Ca:1 | | 1170 | 132 | 2320 | 1380 |
| 51 | 42.0 | 6.0 | 48.0 | 46.0 | — | — | — | Ca:2 | | 1170 | 126 | 2380 | 1510 |
| 52 | 42.0 | 6.0 | 48.0 | 46.0 | — | — | — | Ca:3 | | 1170 | 121 | 2470 | 1730 |
| 53 | 42.0 | 6.0 | 48.0 | 46.0 | — | — | — | Ca:5 | | 1170 | 102 | 2630 | 2130 |
| 54* | 42.0 | 6.0 | 48.0 | 46.0 | — | — | — | Ca:6 | | 1170 | 63 | 2710 | 2640 |
| 55 | 42.0 | 6.0 | 48.0 | 46.0 | — | — | 0.20 | Sr:2 | | 1170 | 148 | 2430 | 1370 |
| 56 | 420 | 6.0 | 48.0 | 46.0 | — | — | 0.20 | Sr:5 | | 1170 | 125 | 2550 | 2060 |
| 57* | 42.0 | 6.0 | 48.0 | 46.0 | — | — | 0.20 | Sr:6 | | 1170 | 69 | 2590 | 2560 |
| 58 | 42.0 | 6.0 | 48.0 | 46.0 | — | — | 0.20 | Ba:2 | | 1170 | 145 | 2320 | 1530 |
| 59 | 42.0 | 6.0 | 48.0 | 46.0 | — | — | 0.20 | Ba:5 | | 1170 | 120 | 2560 | 2070 |
| 60* | 42.0 | 6.0 | 48.0 | 46.0 | — | — | 0.20 | Ba:6 | | 1170 | 72 | 2580 | 2570 |
| 61 | 42.0 | 6.0 | 48.0 | 46.0 | — | 0.10 | — | Ba:2 | | 1170 | 129 | 2120 | 1520 |
| 62 | 420 | 6.0 | 48.0 | 46.0 | — | 0.20 | — | Ba:2 | | 1170 | 134 | 2330 | 1410 |
| 63 | 42.0 | 6.0 | 48.0 | 46.0 | — | 0.50 | — | Ba:2 | | 1170 | 157 | 1510 | 1530 |
| 64* | 42.0 | 6.0 | 48.0 | 46.0 | — | 0.60 | — | Ba:2 | | 1170 | 162 | 780 | 1580 |
| 65 | 420 | 6.0 | 48.0 | 46.0 | 0.10 | — | — | Ca:1 | Sr:1 | 1170 | 146 | 2720 | 1430 |
| 66 | 42.0 | 6.0 | 48.0 | 46.0 | 0.10 | — | — | Ca:1 | Ba:1 | 1170 | 142 | 2550 | 1720 |
| 67 | 42.0 | 6.0 | 48.0 | 46.0 | 0.10 | — | — | Ca:1 | La:1 | 1170 | 129 | 2440 | 1880 |
| 68 | 42.0 | 6.0 | 48.0 | 46.0 | 0.10 | — | — | Ba:2 | La:2 | 1170 | 122 | 2220 | 2320 |
| 69 | 42.0 | 6.0 | 48.0 | 46.0 | 0.10 | — | — | Ba:3 | La:2 | 1170 | 115 | 1780 | 2450 |
| 70* | 42.0 | 6.0 | 48.0 | 46.0 | 0.10 | — | — | Ba:4 | La:2 | 1170 | 82 | 1700 | 3250 |

*Examples for comparison according to the prior art

The asterisked samples in Tables 1 through 4 are examples for comparison which are not in accordance with the preferred embodiments of the invention, and other samples are in accordance with the preferred embodiments of the present invention.

In tables 1 through 4, d31 represents a piezoelectric constant; Qm represents a mechanical quality factor; and C-TC represents the temperature coefficient of an electrostatic capacity at −20° to 80° C.

The piezoelectric characteristics were obtained through calculations of resonance frequencies and antiresonance frequencies measured by an impedance meter (in accordance with Japan Electronic Material Industrial Association Standard (EMAS-6100)). The measurement frequency for the temperature coefficient was 1 KHz.

In a piezoelectric ceramic composition according to the preferred embodiments of the present invention, the ratio of the third component of the basic composition and the ratio between the oxides, i.e., the values of a, b, and c, are defined as described above because ratios outside of this range will give undesirably small piezoelectric constants (d31) and mechanical quality factors (Qm) and poor temperature coefficients (C-TC). The reasons for such a limitation will be described in the following paragraphs.

An examination of the characteristics of the piezoelectric ceramics (samples) having sample numbers 1 through 23 in Tables 1 and 2 indicates that for the samples (examples for comparison) in which the values of a, b, and c are not in accordance with the preferred embodiments of the present invention, at least one of the piezoelectric constant (d31) and the mechanical quality factor (Qm) is extremely small or the temperature coefficient (C-TC) is so large that the temperature characteristics deteriorate.

Referring to the value a, for example, for a sample whose value a is less than 2 mol % such as the sample No. 7 on Table 1 (the value a is 1.0 mol % for the sample No. 7) the piezoelectric constant (d31) and mechanical quality factor (Qm) are undesirable As apparent from the sample No. 17 on Table 1, for a sample whose value a exceeds 10 mol % (the value a is 12.0 mol % for the sample No. 17), the temperature coefficient (C-TC) is undesirable and the piezoelectric constant (d31) and mechanical quality factor (Qm) are poor.

It is therefore preferable that the value a in the above-described general formula (1) is in the range of about 2 to 10 mol %. In another preferred embodiments, the range for a is about 5 to 6 mol %.

Referring to the value b, for example, for a sample whose value b is less than 40 mol % such s the sample No. 18 on Table 1 (the value b is 38 mol % for the sample No. 18), the piezoelectric constant (d31) and mechanical quality factor (Qm) are undesirable Further, as apparent from the samples No. 22 and No. 23 on Table 2, a sample whose vale b exceeds 52 mol % (the value b is 54 mol % and 58.0 mol % for the samples No. 22 and No. 23, respectively) has an undesirable piezoelectric constant (d31).

It is therefore preferable that the value b in the above-described general formula (1) is in,the range of about 40 to 52 mol %. In another preferred embodiment, the range for b is about 44 to 50 mol %.

The value c in the above-described general formula (1) is a value which is automatically determined by the values a and b because a+b+c=100.

Although no limit is placed on the value x for a piezoelectric ceramic composition according to the preferred embodiments of the present invention, x is preferably in the range from about 35% to about 48% (from about 0.35 to 0.48) in order to obtain a practicable piezoelectric ceramic having good characteristics. For example, the piezoelectric ceramic having sample number 1 whose value x is less than 35% (0.35) is susceptible to warpage and is therefore unpracticable. In another preferred embodiment, the range for x is about 36% to 42% (from about 0.36 to 0.42).

The samples No. 24 through No. 35 on Table 2 are piezoelectric ceramics which have been added with magnesium (magnesium compound) in varying amounts. Those samples indicate that although the addition of magnesium improves the mechanical quality factor (Qm), the mechanical quality factor (Qm) is conversely reduced significantly if the amount of magnesium added exceeds 0.50% by weight in terms of $Mg(OH)_2$.

The samples No. 36 through No. 40 on Table 2 are piezoelectric ceramics which have been added with cobalt (cobalt compound) in varying amounts. Those samples indicate that the change in characteristics caused by the addition of cobalt has the same tendency as that caused by the addition of magnesium as described above.

The samples No. 41 through No. 45 on Table 2 are piezoelectric ceramics which have been added with nickel (nickel compound) in varying amounts. The change in characteristics caused by the addition of nickel also has the same tendency as that caused by the addition of magnesium as described above.

It is apparent from the samples No. 46 though No. 48 on Table 3 that the addition of two or more of the elements magnesium (magnesium compound), cobalt (cobalt compound), and nickel (nickel compound) provides a piezoelectric ceramic having a large piezoelectric constant (d31), a large mechanical quality factor (Qm), and good temperature characteristics. As apparent from the sample No. 49 on Table 3, however, the mechanical quality factor (Qm) tends to deteriorate significantly when the total amount of the added magnesium, cobalt, and nickel (the sum of the added values in terms of $Mg(OH)_2$, CoO, and NiO) exceeds 0.50% by weight.

It is therefore necessary to adjust the amounts of the added magnesium, cobalt, and nickel in terms of $Mg(OH)_2$, CoO, and NiO, respectively, so that they total at 0.50% or less by weight.

Further, Tables 5 and 6 show characteristics obtained by adding combinations of magnesium and cobalt, magnesium and nickel, cobalt and nickel, and magnesium, cobalt, and nickel. The values of magnesium, cobalt, and nickel shown in Tables 5 and 6 are the values of the added magnesium, cobalt, and nickel compounds in terms of $Mg(OH)_2$, CoO, and NiO, respectively. In Tables 5 and 6, the samples having asterisked sample numbers are examples for comparison which are not in accordance with the preferred embodiments of the present invention, and the remaining samples are in accordance with the preferred embodiments of the present invention.

TABLE 5

| Sample No | Composition | | | | | | | Firing | Characteristics | | |
|---|---|---|---|---|---|---|---|---|---|---|---|
| | X (%) | a (mol %) | b (mol %) | c (mol %) | Mg (% by weight) | Co (% by weight) | Ni (% by weight) | Temp (°C.) | $d_{31}$ (p C/N) | Qm | C-TC (ppm/°C.) |
| 101 | 42.0 | 5.0 | 49.0 | 46.0 | 0.10 | 0.10 | — | 1190 | 144 | 2330 | 1590 |
| 102 | 42.00 | 5.0 | 49.0 | 46.0 | 0.10 | 0.40 | — | 1190 | 152 | 1160 | 1480 |
| 103* | 42.00 | 5.0 | 49.0 | 46.0 | 0.10 | 0.50 | — | 1190 | 164 | 410 | 1320 |
| 104 (=46) | 42.00 | 5.0 | 49.0 | 46.0 | 0.20 | 0.10 | — | 1190 | 145 | 2250 | 1520 |
| 105 | 42.00 | 5.0 | 49.0 | 46.0 | 0.20 | 0.30 | — | 1190 | 157 | 1260 | 1330 |
| 106* | 42.00 | 5.0 | 49.0 | 46.0 | 0.20 | 0.40 | — | 1190 | 163 | 660 | 1240 |
| 107 (=48) | 42.00 | 5.0 | 49.0 | 46.0 | 0.40 | 0.10 | — | 1190 | 153 | 1200 | 1490 |
| 108* | 42.00 | 5.0 | 49.0 | 46.0 | 0.40 | 0.20 | — | 1190 | 159 | 480 | 1330 |
| 109 (=49)* | 42.00 | 5.0 | 49.0 | 46.0 | 0.50 | 0.10 | — | 1190 | 142 | 610 | 1470 |
| 110 | 42.00 | 5.0 | 49.0 | 46.0 | 0.10 | — | 0.10 | 1190 | 129 | 2010 | 1560 |
| 111 | 42.00 | 5.0 | 49.0 | 46.0 | 0.10 | — | 0.40 | 1190 | 139 | 1110 | 1320 |
| 112* | 42.00 | 5.0 | 49.0 | 46.0 | 0.10 | — | 0.50 | 1190 | 152 | 420 | 1190 |
| 113 (=47) | 42.00 | 5.0 | 49.0 | 46.0 | 0.20 | — | 0.10 | 1190 | 138 | 2110 | 1380 |
| 114 | 42.00 | 5.0 | 49.0 | 46.0 | 0.20 | — | 0.30 | 1190 | 144 | 1020 | 1310 |
| 115* | 42.00 | 5.0 | 49.0 | 46.0 | 0.20 | — | 0.40 | 1190 | 151 | 390 | 1270 |
| 116 | 42.00 | 5.0 | 49.0 | 46.0 | 0.40 | — | 0.10 | 1190 | 142 | 1070 | 1390 |
| 117* | 42.00 | 5.0 | 49.0 | 46.0 | 0.40 | — | 0.20 | 1190 | 162 | 520 | 1220 |
| 118* | 42.00 | 5.0 | 49.0 | 46.0 | 0.50 | — | 0.10 | 1190 | 164 | 550 | 1230 |
| 119 | 42.00 | 5.0 | 49.0 | 46.0 | — | 0.10 | 0.10 | 1190 | 143 | 2550 | 1480 |
| 120 | 42.00 | 5.0 | 49.0 | 46.0 | — | 0.10 | 0.40 | 1190 | 155 | 1230 | 1380 |

*Examples for comparison according to the prior art

TABLE 6

| Sample No | Composition | | | | | | | Firing | Characteristics | | |
|---|---|---|---|---|---|---|---|---|---|---|---|
| | X (%) | a (mol %) | b (mol %) | c (mol %) | Mg (% by weight) | Co (% by weight) | Ni (% by weight) | Temp (°C.) | $d_{31}$ (p C/N) | Qm | C-TC (ppm/°C.) |
| 121* | 42.0 | 5.0 | 49.0 | 46.0 | — | 0.10 | 0.50 | 1190 | 167 | 440 | 1320 |
| 122 | 42.0 | 5.0 | 49.0 | 46.0 | — | 0.20 | 0.10 | 1190 | 151 | 2330 | 1410 |
| 123 | 42.0 | 5.0 | 49.0 | 46.0 | — | 0.20 | 0.30 | 1190 | 153 | 1160 | 1320 |
| 124* | 42.0 | 5.0 | 49.0 | 46.0 | — | 0.20 | 0.40 | 1190 | 159 | 560 | 1310 |
| 125 | 42.0 | 5.0 | 49.0 | 46.0 | — | 0.40 | 0.10 | 1190 | 128 | 1200 | 1400 |
| 126* | 42.0 | 5.0 | 49.0 | 46.0 | — | 0.40 | 0.20 | 1190 | 149 | 500 | 1220 |
| 127* | 42.0 | 5.0 | 49.0 | 46.0 | — | 0.50 | 0.10 | 1190 | 157 | 480 | 1260 |
| 128 | 42.0 | 5.0 | 49.0 | 46.0 | — | 0.10 | 0.10 | 1190 | 150 | 2420 | 1500 |
| 129 | 42.0 | 5.0 | 49.0 | 46.0 | 0.10 | 0.10 | 0.10 | 1190 | 153 | 1810 | 1420 |
| 130 | 42.0 | 5.0 | 49.0 | 46.0 | 0.20 | 0.20 | 0.10 | 1190 | 157 | 1230 | 1370 |
| 131* | 42.0 | 5.0 | 49.0 | 46.0 | 0.20 | 0.10 | 0.10 | 1190 | 168 | 520 | 1220 |

TABLE 6-continued

| Sample No | Composition | | | | | | Firing | Characteristics | | |
| | X (%) | a (mol %) | b (mol %) | c (mol %) | Mg (% by weight) | Co (% by weight) | Ni (% by weight) | Temp (°C.) | $d_{31}$ (p C/N) | Qm | C-TC (ppm/°C.) |
|---|---|---|---|---|---|---|---|---|---|---|---|
| 132 | 42.0 | 5.0 | 49.0 | 46.0 | 0.40 | 0.20 | 0.10 | 1190 | 154 | 1800 | 1390 |
| 133 | 42.0 | 5.0 | 49.0 | 46.0 | 0.10 | 0.20 | 0.20 | 1190 | 158 | 1330 | 1360 |
| 134* | 42.0 | 5.0 | 49.0 | 46.0 | 0.10 | 0.40 | 0.10 | 1190 | 172 | 490 | 1110 |
| 135 | 42.0 | 5.0 | 49.0 | 46.0 | 0.10 | 0.10 | 0.20 | 1190 | 151 | 1880 | 1390 |
| 136 | 42.0 | 5.0 | 49.0 | 46.0 | 0.20 | 0.10 | 0.20 | 1190 | 152 | 1090 | 1320 |
| 137* | 42.0 | 5.0 | 49.0 | 46.0 | 0.10 | 0.10 | 0.40 | 1190 | 154 | 480 | 1250 |

*Examples for comparison according to the prior art

For simplicity in comparison, the data for the samples No. 46 through No. 49 shown in Table 3 are duplicated in Tables 5 and 6.

As apparent from Tables 5 and 6, piezoelectric ceramics having a large piezoelectric constant (d31), a large mechanical quality factor (Qm), and good temperature characteristics can be obtained by adding magnesium, cobalt, and nickel in combinations wherein the amounts of those elements in terms of $Mg(OH)_2$, CoO, and NiO, respectively, are in ratios such that they total at 0.50% or less by weight.

The samples No. 50 through No. 54 on Table 4 are samples wherein calcium is substituted for a part of lead. For the samples wherein the substituted amount is in accordance with the preferred embodiments of the present invention, the mechanical quality factor (Qm) is increased while the piezoelectric constant (d31) and temperature coefficient (C-TC) are deteriorated when the substituted amount exceeds 5 mol % (sample No. 54). The substitution for lead (i.e., A-site) also provides another advantage in that the degree of sintering is improved.

It is further apparent from the samples No. 55 through No. 70 on Table 4 that the addition of magnesium, cobalt, and nickel to a system in which at least one of calcium, strontium, barium, and lanthanum is substituted for apart of lead, provides the same effect as that available in a system wherein lead is not substituted and that the piezoelectric constant (d31) is improved when the added amounts in terms of $Mg(OH)_2$, CoO, and NiO total at 0.50% or less by weight.

As apparent from the samples No. 57, 60, and 70, even in a system added with magnesium, cobalt, and nickel as described above, the piezoelectric constant (d31) and temperature coefficient (C-TC) are deteriorated when the total amount of substitution with at least one of calcium, strontium, barium, and lanthanum exceeds 5 mol %.

It is therefore preferable that the amount of at least one of calcium, strontium, barium, and lanthanum substituted for a part of lead is 5 mol % or less.

However, the mechanical quality factor (Qm) tends to deteriorate even for a sample wherein lead (i.e., A-site) is substituted by 5 mol % or less when the amount of the added magnesium, cobalt, and nickel (the sum of the values of them in terms of $Mg(OH)_2$, CoO, and NiO, respectively) exceeds 0.50% by weight (see sample No. 64).

Tables 7 through 11 show characteristics obtained by various combinations of the addition of the additives magnesium, cobalt, and nickel and the elements for substitution calcium, strontium, barium, and lanthanum. In Tables 7 through 11, the values of magnesium, cobalt, and nickel are the values of the added magnesium, cobalt, and nickel compounds in terms of $Mg(OH)_2$, CoO, and NiO. Further, in Tables 7 through 11, the samples having asterisked sample numbers are examples for comparison which are not in accordance with the preferred embodiments of the present invention, and the remaining samples are preferred embodiments in accordance with the preferred embodiments of the present invention.

TABLE 7

| Sample No. | Composition | | | | | | | Type and quantity of element to replace Pb (mol %) | Firing Temp (°C.) | Characteristic | | |
| | X (%) | a (mol %) | b (mol %) | c (mol %) | Mg (% by weight) | Co (% by weight) | Ni (% by weight) | | | $d_{31}$ (p C/N) | Qm | C-TC (ppm/°C.) |
|---|---|---|---|---|---|---|---|---|---|---|---|---|
| 138 (=50) | 42.0 | 6.0 | 48.0 | 46.0 | — | — | — | Ca:1 | 1170 | 132 | 2320 | 1380 |
| 139 (=51) | 42.0 | 6.0 | 48.0 | 46.0 | — | — | — | Ca:2 | 1170 | 126 | 2380 | 1510 |
| 140 (=52) | 42.0 | 6.0 | 48.0 | 46.0 | — | — | — | Ca:3 | 1170 | 121 | 2470 | 1730 |
| 141 (=53) | 42.0 | 6.0 | 48.0 | 46.0 | — | — | — | Ca:5 | 1170 | 102 | 2630 | 2130 |
| 142 (=54)* | 42.0 | 6.0 | 48.0 | 46.0 | — | — | — | Ca:6 | 1170 | 63 | 2710 | 2640 |
| 143 | 42.0 | 6.0 | 48.0 | 46.0 | — | — | — | Sr:1 | 1170 | 142 | 1940 | 1360 |
| 144 | 42.0 | 6.0 | 48.0 | 46.0 | — | — | — | Sr:5 | 1170 | 107 | 2430 | 2110 |
| 145* | 42.0 | 6.0 | 48.0 | 46.0 | — | — | — | Sr:6 | 1170 | 74 | 2600 | 2530 |
| 146 | 42.0 | 6.0 | 48.0 | 46.0 | — | — | — | Ba:1 | 1170 | 138 | 1970 | 1400 |
| 147 | 42.0 | 6.0 | 48.0 | 46.0 | — | — | — | Ba:5 | 1170 | 104 | 2540 | 2120 |
| 148* | 42.0 | 6.0 | 48.0 | 46.0 | — | — | — | Ba:6 | 1170 | 69 | 2720 | 2510 |
| 149 | 42.0 | 6.0 | 48.0 | 46.0 | — | — | — | La:1 | 1170 | 136 | 2000 | 1370 |
| 150 | 42.0 | 6.0 | 48.0 | 46.0 | — | — | — | La:5 | 1170 | 105 | 2510 | 2010 |
| 151* | 42.0 | 6.0 | 48.0 | 46.0 | — | — | — | La:6 | 1170 | 60 | 2790 | 2500 |

TABLE 7-continued

| Sample No. | Composition | | | | | | Type and quantity of element to replace Pb (mol %) | Firing Temp (°C.) | Characteristic | | |
|---|---|---|---|---|---|---|---|---|---|---|---|
| | X (%) | a (mol %) | b (mol %) | c (mol %) | Mg (% by weight) | Co (% by weight) | Ni (% by weight) | | | $d_{31}$ (p C/N) | Qm | C-TC (ppm/°C.) |

| Sample No. | X (%) | a (mol %) | b (mol %) | c (mol %) | Mg (% by weight) | Co (% by weight) | Ni (% by weight) | replace Pb (mol %) | Temp (°C.) | $d_{31}$ (p C/N) | Qm | C-TC (ppm/°C.) |
|---|---|---|---|---|---|---|---|---|---|---|---|---|
| 152 | 42.0 | 6.0 | 48.0 | 46.0 | 0.10 | — | — | Ba:2 | 1170 | 121 | 3230 | 1260 |
| 153 | 42.0 | 6.0 | 48.0 | 46.0 | 0.50 | — | — | Ca:1 | 1170 | 130 | 1460 | 1180 |
| 154* | 42.0 | 6.0 | 48.0 | 46.0 | 0.60 | — | — | Ca:1 | 1170 | 145 | 700 | 1050 |
| 155 | 42.0 | 6.0 | 48.0 | 46.0 | — | 0.10 | — | Ca:1 | 1170 | 125 | 3080 | 1250 |
| 156 | 42.0 | 6.0 | 48.0 | 46.0 | — | 0.50 | — | Ca:1 | 1170 | 143 | 1660 | 1100 |
| 157* | 42.0 | 6.0 | 48.0 | 46.0 | — | 0.60 | — | Ca:1 | 1170 | 146 | 870 | 1010 |

*Examples for comparison according to the prior art

TABLE 8

| Sample No. | X (%) | a (mol %) | b (mol %) | c (mol %) | Mg (% by weight) | Co (% by weight) | Ni (% by weight) | replace Pb (mol %) | Temp (°C.) | $d_{31}$ (p C/N) | Qm | C-TC (ppm/°C.) |
|---|---|---|---|---|---|---|---|---|---|---|---|---|
| 158 | 42.0 | 6.0 | 48.0 | 46.0 | — | — | 0.10 | Ca:1 | 1170 | 121 | 3060 | 1040 |
| 159 | 42.0 | 6.0 | 48.0 | 46.0 | — | — | 0.50 | Ca:1 | 1170 | 127 | 1480 | 860 |
| 160* | 42.0 | 6.0 | 48.0 | 46.0 | — | — | 0.60 | Ca:1 | 1170 | 136 | 790 | 900 |
| 161 | 42.0 | 6.0 | 48.0 | 46.0 | 0.10 | — | — | Ca:5 | 1170 | 104 | 3760 | 1950 |
| 162 | 42.0 | 6.0 | 48.0 | 46.0 | 0.50 | — | — | Ca:5 | 1170 | 111 | 1360 | 1820 |
| 163* | 42.0 | 6.0 | 48.0 | 46.0 | 0.60 | — | — | Ca:5 | 1170 | 122 | 800 | 1620 |
| 164 | 42.0 | 6.0 | 48.0 | 46.0 | — | 0.10 | — | Ca:5 | 1170 | 107 | 3500 | 1930 |
| 165 | 42.0 | 6.0 | 48.0 | 46.0 | — | 0.50 | — | Ca:5 | 1170 | 120 | 1590 | 1700 |
| 166* | 42.0 | 6.0 | 48.0 | 46.0 | — | 0.60 | — | Ca:5 | 1170 | 123 | 820 | 1550 |
| 167 | 42.0 | 6.0 | 48.0 | 46.0 | — | — | 0.10 | Ca:5 | 1170 | 104 | 3600 | 1600 |
| 168 | 42.0 | 6.0 | 48.0 | 46.0 | — | — | 0.50 | Ca:5 | 1170 | 108 | 1370 | 1180 |
| 169* | 42.0 | 6.0 | 48.0 | 46.0 | — | — | 0.60 | Ca:5 | 1170 | 115 | 740 | 1230 |
| 170* | 420 | 6.0 | 48.0 | 46.0 | 0.10 | — | — | Ca:6 | 1170 | 58 | 3700 | 2520 |
| 171 (=55) | 42.0 | 6.0 | 48.0 | 46.0 | — | — | 0.20 | Sr:2 | 1170 | 148 | 2430 | 1570 |
| 172 | 42.0 | 6.0 | 48.0 | 46.0 | — | — | 0.50 | Sr:2 | 1170 | 152 | 1330 | 1480 |
| 173* | 42.0 | 6.0 | 48.0 | 46.0 | — | — | 0.60 | Sr:2 | 1170 | 156 | 710 | 1460 |
| 174 (=56) | 42.0 | 6.0 | 48.0 | 46.0 | — | — | 0.20 | Sr:5 | 1170 | 125 | 2550 | 2060 |
| 175 | 42.0 | 6.0 | 48.0 | 46.0 | — | — | 0.50 | Sr:5 | 1170 | 128 | 1420 | 1870 |
| 176* | 42.0 | 6.0 | 48.0 | 46.0 | — | — | 0.60 | Sr:5 | 1170 | 132 | 730 | 1750 |
| 177 (=57)* | 42.0 | 6.0 | 48.0 | 46.0 | — | — | 0.20 | Sr:6 | 1170 | 69 | 2590 | 2560 |

*Examples for comparison according to the prior art

TABLE 9

| Sample No. | X (%) | a (mol %) | b (mol %) | c (mol %) | Mg (% by weight) | Co (% by weight) | Ni (% by weight) | replace Pb (mol %) | Temp (°C.) | $d_{31}$ (p C/N) | Qm | C-TC (ppm/°C.) |
|---|---|---|---|---|---|---|---|---|---|---|---|---|
| 178 (=61) | 42.0 | 6.0 | 48.0 | 46.0 | — | 0.10 | — | Ba:2 | 1170 | 129 | 2120 | 1520 |
| 179 (=62) | 42.0 | 6.0 | 48.0 | 46.0 | — | 0.20 | — | Ba:2 | 1170 | 134 | 2330 | 1410 |
| 180 (=63) | 42.0 | 6.0 | 48.0 | 46.0 | — | 0.50 | — | Ba:2 | 1170 | 157 | 1510 | 1530 |
| 181 (=64)* | 42.0 | 6.0 | 48.0 | 46.0 | — | 0.60 | — | Ba:2 | 1170 | 162 | 780 | 1580 |
| 182 (=58) | 42.0 | 6.0 | 48.0 | 46.0 | — | — | 0.20 | Ba:2 | 1170 | 145 | 2320 | 1530 |
| 183 | 42.0 | 6.0 | 48.0 | 46.0 | — | — | 0.50 | Ba:2 | 1170 | 151 | 1280 | 1400 |
| 184* | 42.0 | 6.0 | 48.0 | 46.0 | — | — | 0.60 | Ba:2 | 1170 | 156 | 790 | 1380 |

TABLE 9-continued

| Sample No. | Composition | | | | | | | Type and quantity of element to replace Pb (mol %) | Firing Temp (°C.) | Characteristic | | |
|---|---|---|---|---|---|---|---|---|---|---|---|---|
| | X (%) | a (mol %) | b (mol %) | c (mol %) | Mg (% by weight) | Co (% by weight) | Ni (% by weight) | | | $d_{31}$ (p C/N) | Qm | C-TC (ppm/°C.) |
| 185 (=59) | 42.0 | 6.0 | 48.0 | 46.0 | — | — | 0.20 | Ba:5 | 1170 | 120 | 2560 | 2070 |
| 186 | 42.0 | 6.0 | 48.0 | 46.0 | — | — | 0.50 | Ba:5 | 1170 | 132 | 1390 | 1850 |
| 187* | 42.0 | 6.0 | 48.0 | 46.0 | — | — | 0.60 | Ba:5 | 1170 | 136 | 770 | 1780 |
| 188 (=60)* | 42.0 | 6.0 | 48.0 | 46.0 | — | — | 0.20 | Ba:6 | 1170 | 72 | 2580 | 2570 |
| 189 | 42.0 | 6.0 | 48.0 | 46.0 | — | — | 0.20 | La:2 | 1170 | 145 | 2330 | 1630 |
| 190 | 42.0 | 6.0 | 48.0 | 46.0 | — | — | 0.50 | La:2 | 1170 | 150 | 1280 | 1520 |
| 191* | 42.0 | 6.0 | 48.0 | 46.0 | — | — | 0.60 | La:2 | 1170 | 152 | 760 | 1440 |
| 192 | 42.0 | 6.0 | 48.0 | 46.0 | — | — | 0.20 | La:5 | 1170 | 122 | 2470 | 2130 |
| 193 | 42.0 | 6.0 | 48.0 | 46.0 | — | — | 0.50 | La:5 | 1170 | 131 | 1320 | 1770 |
| 194* | 42.0 | 6.0 | 48.0 | 46.0 | — | — | 0.60 | La:5 | 1170 | 139 | 700 | 1740 |
| 195* | 42.0 | 6.0 | 48.0 | 46.0 | — | — | 0.20 | La:6 | 1170 | 77 | 2620 | 2710 |
| 196 | 42.0 | 6.0 | 48.0 | 46.0 | 0.10 | 0.10 | 0.10 | Ca:1 | 1170 | 132 | 2850 | 1250 |
| 197 | 42.0 | 6.0 | 48.0 | 46.0 | 0.20 | 0.10 | 0.10 | Ca:1 | 1170 | 135 | 2280 | 1180 |

*Examples for comparison according to the prior art

TABLE 10

| Sample No. | Composition | | | | | | | Type and quantity of element to replace Pb (mol %) | Firing Temp (°C.) | Characteristic | | |
|---|---|---|---|---|---|---|---|---|---|---|---|---|
| | X (%) | a (mol %) | b (mol %) | c (mol %) | Mg (% by weight) | Co (% by weight) | Ni (% by weight) | | | $d_{31}$ (p C/N) | Qm | C-TC (ppm/°C.) |
| 198 | 42.0 | 6.0 | 48.0 | 46.0 | 0.20 | 0.20 | 0.10 | Ca:1 | 1170 | 138 | 1550 | 1140 |
| 199* | 42.0 | 6.0 | 48.0 | 46.0 | 0.40 | 0.10 | 0.10 | Ca:1 | 1170 | 148 | 660 | 1010 |
| 200 | 42.0 | 6.0 | 48.0 | 46.0 | 0.10 | 0.10 | 0.10 | Ca:3 | 1170 | 121 | 3050 | 1560 |
| 201 | 42.0 | 6.0 | 48.0 | 46.0 | 0.20 | 0.10 | 0.10 | Ca:3 | 1170 | 123 | 2430 | 1480 |
| 202 | 42.0 | 6.0 | 48.0 | 46.0 | 0.20 | 0.20 | 0.10 | Ca:3 | 1170 | 127 | 1650 | 1430 |
| 203* | 42.0 | 6.0 | 48.0 | 46.0 | 0.40 | 0.10 | 0.10 | Ca:3 | 1170 | 136 | 700 | 1270 |
| 204 | 42.0 | 6.0 | 48.0 | 46.0 | 0.10 | 0.10 | 0.10 | Ca:5 | 1170 | 107 | 3260 | 1930 |
| 205 | 42.0 | 6.0 | 48.0 | 46.0 | 0.20 | 0.10 | 0.10 | Ca:5 | 1170 | 109 | 2590 | 1820 |
| 206 | 42.0 | 6.0 | 48.0 | 46.0 | 0.20 | 0.20 | 0.10 | Ca:5 | 1170 | 112 | 1760 | 1760 |
| 207* | 42.0 | 6.0 | 48.0 | 46.0 | 0.40 | 0.10 | 0.10 | Ca:5 | 1170 | 119 | 740 | 1570 |
| 208 (=65) | 42.0 | 6.0 | 48.0 | 46.0 | 0.10 | — | — | Ca:1 Sr:1 | 1170 | 146 | 2720 | 1430 |
| 209 (=66) | 42.0 | 6.0 | 48.0 | 46.0 | 0.10 | — | — | Ca:1 Ba:1 | 1170 | 142 | 2550 | 1720 |
| 210 (=67) | 420 | 6.0 | 48.0 | 46.0 | 0.10 | — | — | Ca:1 La:1 | 1170 | 129 | 2440 | 1880 |
| 211 (=68) | 42.0 | 6.0 | 48.0 | 46.0 | 0.10 | — | — | Ba:2 La:2 | 1170 | 122 | 2220 | 2320 |
| 212 | 42.0 | 6.0 | 48.0 | 46.0 | 0.10 | 0.10 | 0.10 | Ba:2 La:2 | 1170 | 132 | 1900 | 2290 |
| 213 | 42.0 | 6.0 | 48.0 | 46.0 | 0.30 | 0.10 | 0.10 | Ba:2 La:2 | 1170 | 135 | 1060 | 1970 |
| 214* | 42.0 | 6.0 | 48.0 | 46.0 | 0.40 | 0.10 | 0.10 | Ba:2 La:2 | 1170 | 148 | 650 | 1860 |
| 215 (=69) | 42.0 | 6.0 | 48.0 | 46.0 | 0.10 | — | — | Ba:3 La:2 | 1170 | 115 | 1780 | 2450 |
| 216 (=70)* | 42.0 | 6.0 | 48.0 | 46.0 | 0.10 | — | — | Ba:4 La:2 | 1170 | 82 | 1700 | 3250 |

*Examples for comparison according to the prior art

TABLE 11

| Sample No. | Composition | | | | | | | Type and quantity of element to replace Pb (mol %) | Firing Temp (°C.) | Characteristic | | |
|---|---|---|---|---|---|---|---|---|---|---|---|---|
| | X (%) | a (mol %) | b (mol %) | c (mol %) | Mg (% by weight) | Co (% by weight) | Ni (% by weight) | | | $d_{31}$ (p C/N) | Qm | C-TC (ppm/°C.) |
| 217 | 42.0 | 6.0 | 48.0 | 46.0 | — | — | — | Ca:1 Sr:1 Ba:1 La:1 | 1170 | 128 | 2290 | 1810 |
| 218 | 42.0 | 6.0 | 48.0 | 46.0 | 0.10 | — | — | Ca:1 Sr:1 | 1170 | 118 | 3280 | 1660 |

TABLE 11-continued

| Sample No. | X (%) | a (mol %) | b (mol %) | c (mol %) | Mg (% by weight) | Co (% by weight) | Ni (% by weight) | Type and quantity of element to replace Pb (mol %) | | Firing Temp (°C.) | $d_{31}$ (p C/N) | Qm | C-TC (ppm/°C.) |
|---|---|---|---|---|---|---|---|---|---|---|---|---|---|
| 219 | 42.0 | 6.0 | 48.0 | 46.0 | 0.50 | — | — | Ba:1 Ca:1 | La:1 Sr:1 | 1170 | 126 | 1440 | 1550 |
| 220* | 42.0 | 6.0 | 48.0 | 46.0 | 0.60 | — | — | Ba:1 Ca:1 | La:1 Sr:1 | 1170 | 141 | 700 | 1370 |
| 221 | 42.0 | 6.0 | 48.0 | 46.0 | 0.10 | 0.10 | — | Ba:1 Ca:1 | La:1 Sr:1 | 1170 | 123 | 2700 | 1730 |
| 222 | 42.0 | 6.0 | 48.0 | 46.0 | 0.40 | 0.10 | — | Ba:1 Ca:1 | La:1 Sr:1 | 1170 | 131 | 1490 | 1630 |
| 223 | 42.0 | 6.0 | 48.0 | 46.0 | 0.50 | 0.10 | — | Ba:1 Ca:1 | La:1 Sr:1 | 1170 | 121 | 760 | 1600 |
| 224 | 42.0 | 6.0 | 48.0 | 46.0 | 0.10 | 0.10 | 0.10 | Ba:1 Ca:1 | La:1 Sr:1 | 1170 | 128 | 2810 | 1640 |
| 225 | 42.0 | 6.0 | 48.0 | 46.0 | 0.30 | 0.10 | 0.10 | Ba:1 Ca:1 | La:1 Sr:1 | 1170 | 131 | 1120 | 1410 |
| 226* | 42.0 | 6.0 | 48.0 | 46.0 | 0.40 | 0.10 | 0.10 | Ba:1 Ca:1 | La:1 Sr:1 | 1170 | 143 | 650 | 1330 |
| 227* | 42.0 | 6.0 | 48.0 | 46.0 | 0.10 | — | — | Ba:1 Ca:3 | La:1 Sr:1 | 1170 | 80 | 2590 | 2650 |

*Examples for comparison according to the prior art

For simplicity in comparison, the data for the samples No. 50 through No. 70 shown in Table 4 as described above are duplicated in Tables 7 through 11.

As apparent from Tables 7 through 11, the combination of the additional of the additives magnesium, cobalt, and nickel and the substitution using the elements calcium, strontium, barium, and lanthanum provides a piezoelectric ceramic having a large piezoelectric constant (D31), a large mechanical quality factor (Qm), and good temperature characteristics.

As described above, a piezoelectric ceramic composition according to the preferred embodiments of the present invention expressed by a general formula:

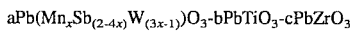

wherein the values (mol %) of a, b, and c are in ranges $2 \leq a \leq 10$, $40 \leq b \leq 52$, and $38 \leq c \leq 58$, respectively and at least one of magnesium, cobalt, and nickel is added as needed; and at least one of calcium, strontium, barium, and lanthanum is substituted for a part of lead, has a large piezoelectric constant and a large mechanical quality factor, has stable temperature characteristics, and consistently provides large vibrations even under conditions wherein the temperature fluctuates.

In addition, since it can be fired at a temperature which is about 100° C. lower than that for conventional pieoelectric ceramic compositions, it is possible to obtain a pieoelectric ceramic having good reproducibility by suppressing the vaporization of the lead oxide.

Therefore, a piezoelectric ceramic composition according to the preferred embodiments of the present invention is advantageous especially as a piezoelectric material for ultrasonic motors, ultrasonic vibrators, piezoelectric actuators, and the like and is suitable for a variety of industrial purposes.

While specific preferred embodiments have been described, it will be appreciated by those skilled in the art that various modifications, changes and additions can be made to the invention without departing from the spirit and scope thereof as set forth in the following claims.

What is claimed is:

1. A piezoelectric ceramic composition expressed by a general formula:

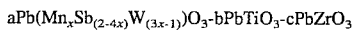

where a, b, and c represent mol % and are in ranges $2 \leq a \leq 10$, $40 \leq b \leq 52$, and $38 \leq c \leq 58$, and $0.35 \leq x \leq 0.48$, respectively, and a+b+c=100).

2. A piezoelectric ceramic composition according to claim 1, further comprising at least one of magnesium, cobalt, and nickel in a ratio of 0.50% or less weight in terms of $Mg(OH)_2$, CoO, NiO to the piezoelectric ceramic composition.

3. A piezoelectric ceramic composition expressed by a general formula:

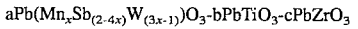

where a, b, and c represent mol % and are in ranges $2 \leq a \leq 10$, $40 \leq b \leq 52$, and $38 \leq c \leq 58$, and $0.35 \leq x \leq 0.48$, respectively, and a+b+c=100), wherein up to 5% of lead is replaced by at least one of calcium, strontium, barium, and lanthanum.

4. A piezoelectric ceramic composition according to claim 3, wherein up to 5% of lead is replaced by at least one of calcium, strontium, barium, and lanthanum and further comprising at least one of magnesium, cobalt, and nickel in a ratio of 0.50% or less by weight in terms of $Mg(OH)_2$, CoO, and NiO.

* * * * *